US009634622B2

(12) United States Patent
Lee et al.

(10) Patent No.: US 9,634,622 B2
(45) Date of Patent: Apr. 25, 2017

(54) WIRELESS COMMUNICATION DEVICE, METHOD AND POWER AMPLIFIER OF THE SAME

(71) Applicant: HTC Corporation, Taoyuan County (TW)

(72) Inventors: Chien-Hua Lee, Taoyuan County (TW); Wei-Shin Tung, Taoyuan County (TW); Yen-Chuan Lin, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 130 days.

(21) Appl. No.: 14/284,408

(22) Filed: May 22, 2014

(65) Prior Publication Data

US 2015/0341002 A1    Nov. 26, 2015

(51) Int. Cl.

| H04B 1/38 | (2015.01) |
|---|---|
| H03F 3/21 | (2006.01) |
| H03F 1/56 | (2006.01) |
| H03F 3/19 | (2006.01) |
| H04B 1/40 | (2015.01) |
| H03F 3/24 | (2006.01) |

(Continued)

(52) U.S. Cl.
CPC ............. *H03F 3/211* (2013.01); *H03F 1/56* (2013.01); *H03F 3/19* (2013.01); *H03F 3/245* (2013.01); *H04B 1/006* (2013.01); *H04B 1/40* (2013.01); *H03F 2200/111* (2013.01); *H03F 2200/204* (2013.01); *H03F 2200/222* (2013.01); *H03F 2200/318* (2013.01); *H03F 2200/378* (2013.01); *H03F 2200/387* (2013.01); *H03F 2200/451* (2013.01); *H03F 2203/21103* (2013.01); *H04B 2001/0408* (2013.01)

(58) Field of Classification Search
CPC .......... H04B 1/56; H04B 1/52; H04B 1/3877; H03G 3/3042; H03F 2200/102
USPC ............................................... 455/552.1, 571
See application file for complete search history.

(56) References Cited

U.S. PATENT DOCUMENTS

| 8,405,462 B2 | 3/2013 | Martineau et al. |
| 2011/0299438 A1* | 12/2011 | Mikhemar ............... H04B 1/18 370/280 |

(Continued)

OTHER PUBLICATIONS

U.S. Appl. No. 61/945,140, filed Feb. 27, 2014 "Wireless Communication Device, Method and Power Amplifier of the Same" by Chien-Hua Lee et al.

(Continued)

*Primary Examiner* — Xin Jia
(74) *Attorney, Agent, or Firm* — CKC & Partners Co., Ltd.

(57) ABSTRACT

A wireless communication device that includes a power amplifier and an antenna is provided. The power amplifier includes a first and a second power amplifying paths and a first and a second matching modules. The first and the second power amplifying paths receive a first and a second input signals respectively. The first matching module includes a first input variable load and a first phase-shifting circuit to respectively adjust the magnitude and the phase of the first input signal to generate a first output signal. The second matching module includes a second input variable load and a second phase-shifting circuit to respectively adjust the magnitude and the phase of the second input signal to generate a second output signal. The antenna is coupled to the power amplifier to transmit the first and the second output signals.

18 Claims, 4 Drawing Sheets

(51) Int. Cl.
H04B 1/00 (2006.01)
H04B 1/04 (2006.01)

(56) References Cited

U.S. PATENT DOCUMENTS

2013/0109434 A1* 5/2013 Dupuy .................... H03F 3/245
                                                    455/552.1
2015/0146583 A1* 5/2015 Yoon ...................... H04B 1/525
                                                    370/278

OTHER PUBLICATIONS

C. Lu, A.-V. H. Pham, and D. Livezey, "Development of multiband phase shifters in 180-nm RF CMOS technology with active loss compensation", IEEE Transactions on Microwave Theory and Techniques, vol. 54, No. 1, pp. 40-45, Jan. 2006.
Corresponding Taiwanese office action that this art reference was cited on Apr. 22, 2016.

* cited by examiner

WIRELESS COMMUNICATION DEVICE, METHOD AND POWER AMPLIFIER OF THE SAME

BACKGROUND

Field of Invention

The present invention relates to a wireless communication technology. More particularly, the present invention relates to a wireless communication device, a wireless communication method and a power amplifier of the same.

Description of Related Art

Transceivers are often disposed in wireless communication systems to process data signals transmitted therethrough. The processing performed by the transceivers may include encoding, modulation, conversion between digital and analog forms, filtering and power amplification. The data signals can be transformed into radio frequency signals that can be transmitted by the antenna. Different transceivers support signals of different modes or of different frequency bands. The signals of different modes or of different frequency bands correspond to different wireless transmission technologies such as GSM (Global System for Mobile Communications), GPRS (Global System for Mobile Communications), WCDMA (Wideband Code Division Multiple Access) and LTE (Long Term Evolution). However, if various power amplifiers corresponding to the data signals of different modes or of different frequency bands are disposed in a wireless communication device or a wireless communication system, the area and the cost of the wireless communication device or the wireless communication system can not be reduced.

Accordingly, what is needed is a wireless communication device, a wireless communication method and a power amplifier of the same to address the above issues.

SUMMARY

An aspect of the present invention is to provide a power amplifier. The power amplifier includes a first and a second power amplifying paths and a first and a second matching modules. The first power amplifying path receives a first input signal within a first frequency range, wherein the first input signal corresponds to one of a plurality of first sub-frequency bands of the first frequency range. The first matching module includes a first input end and a first output end, wherein the first input end is coupled to the first power amplifying path. The first matching module further includes a first input variable load and a first phase-shifting circuit. The first input variable load is electrically connected to the first input end to receive the first input signal therefrom, and the first input variable load adjusts the magnitude of the first input signal by adjusting the load value of the first input variable load. The first phase-shifting circuit includes a first coupler and a group of first phase-shifting variable loads, wherein the first coupler is electrically connected to the first input end and the first output end to receive the first input signal from the first input end, and the phase of the first input signal is adjusted by adjusting the load values of the group of first phase-shifting variable loads to an identical value so as to output a first output signal at the first output end. The second power amplifying path receives a second input signal within a second frequency range, wherein the second input signal corresponds to one of a plurality of second sub-frequency bands of the second frequency range, the frequencies of the second frequency range are higher than those of the first frequency range. The second matching module includes a second input end and a second output end, wherein the second input end is coupled to the second power amplifying path. The second matching module further includes a second input variable load and a second phase-shifting circuit. The second input variable load is electrically connected to the second input end to receive the second input signal therefrom, and the second input variable load adjusts the magnitude of the second input signal by adjusting the load value of the second input variable load. The second phase-shifting circuit includes a second coupler and a group of second phase-shifting variable loads, wherein the second coupler is electrically connected to the second input end and the second output end to receive the second input signal from the second input end, and the phase of the second input signal is adjusted by adjusting the load values of the group of second phase-shifting variable loads to an identical value so as to output a second output signal at the second output end.

Another aspect of the present invention is to provide a wireless communication device. The wireless communication device includes a power amplifier and an antenna. The power amplifier includes a first and a second power amplifying paths and a first and a second matching modules. The first power amplifying path receives a first input signal within a first frequency range, wherein the first input signal corresponds to one of a plurality of first sub-frequency bands of the first frequency range. The first matching module includes a first input end and a first output end, wherein the first input end is coupled to the first power amplifying path. The first matching module further includes a first input variable load and a first phase-shifting circuit. The first input variable load is electrically connected to the first input end to receive the first input signal therefrom, and the first input variable load adjusts the magnitude of the first input signal by adjusting the load value of the first input variable load. The first phase-shifting circuit includes a first coupler and a group of first phase-shifting variable loads, wherein the first coupler is electrically connected to the first input end and the first output end to receive the first input signal from the first input end, and the phase of the first input signal is adjusted by adjusting the load values of the group of first phase-shifting variable loads to an identical value so as to output a first output signal at the first output end. The second power amplifying path receives a second input signal within a second frequency range, wherein the second input signal corresponds to one of a plurality of second sub-frequency bands of the second frequency range, the frequencies of the second frequency range are higher than those of the first frequency range. The second matching module includes a second input end and a second output end, wherein the second input end is coupled to the second power amplifying path. The second matching module further includes a second input variable load and a second phase-shifting circuit. The second input variable bad is electrically connected to the second input end to receive the second input signal therefrom, and the second input variable load adjusts the magnitude of the second input signal by adjusting the load value of the second input variable load. The second phase-shifting circuit includes a second coupler and a group of second phase-shifting variable loads, wherein the second coupler is electrically connected to the second input end and the second output end to receive the second input signal from the second input end, and the phase of the second input signal is adjusted by adjusting the load values of the group of second phase-shifting variable loads to an identical value so as to output a second output signal at the second output end. The antenna is coupled to the power amplifier to transmit the first output signal and/or the second output signal.

Yet another aspect of the present invention is to provide a wireless communication method used in a wireless communication device. The wireless communication method includes the steps outlined below. A first input signal within a first frequency range is received through a first power amplifying path and/or receiving a second input signal within a second frequency range through a second power amplifying path; wherein the first input signal corresponds to one of a plurality of first sub-frequency bands of the first frequency range and the second input signal corresponds to one of a plurality of second sub-frequency bands of the second frequency range, the frequencies of the second frequency range are higher than those of the first frequency range. The magnitude of the first input signal is adjusted by adjusting the load value of a first input variable load in a first matching module. The first input signal is received by a first coupler in a first phase-shifting circuit in the first matching module and the phase of the first input signal is adjusted by adjusting the load values of a group of first phase-shifting variable loads in the first phase-shifting circuit to an identical value so as to output a first output signal. The group of first phase-shifting variable loads are electrically connected to the first coupler. The magnitude of the second input signal is adjusted by adjusting the load value of a second input variable load in a second matching module. The second input signal is received by a second coupler in a second phase-shifting circuit in the second matching module and the phase of the second input signal is adjusted by adjusting the load values of a group of second phase-shifting variable loads in the second phase-shifting circuit to an identical value so as to output a second output signal. The group of second phase-shifting variable loads are electrically connected to the second coupler. The first output signal and/or the second output signal are transmitted through an antenna.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
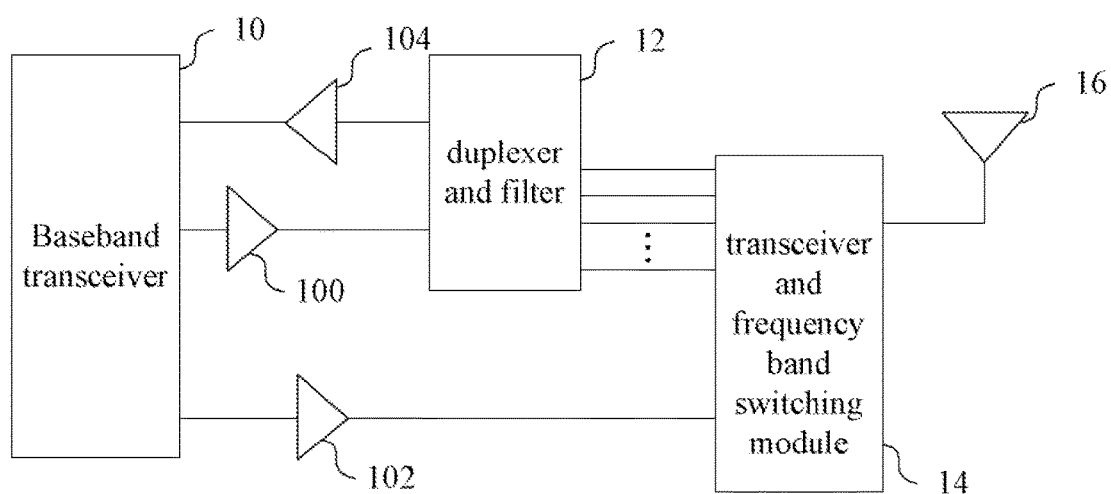
FIG. 1 is a block diagram of a wireless communication device in an embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a block diagram of a wireless communication device 1 in an embodiment of the present invention. The wireless communication device 1 includes baseband transceiver 10, a duplexer and filter 12, a transceiver and frequency band switching module 14 and an antenna 16.

As illustrated in FIG. 1, in the data transmission process, the baseband transceiver 10 generates a 3 G or 4 G data signal such that the 3 G or 4 G data signal is amplified and matched by a power amplifier 100. The 3 G or 4 G data signal is further processed by the duplexer and filter 12 and the transceiver and frequency band switching module 14 and is transmitted by the antenna 16. The 2 G data signal generated by the baseband transceiver 10 is amplified and matched by a power amplifier 102. The 2 G data signal is further processed by the transceiver and frequency band switching module 14 and is transmitted by the antenna 16.

In the data receiving process, the data signal received by the antenna 16 is processed by the transceiver and frequency band switching module 14 and the duplexer and filter 12. The received data signal is further amplified and matched by a low noise amplifier (LNA) 104 and is received by the baseband transceiver 10.

Figure 2:
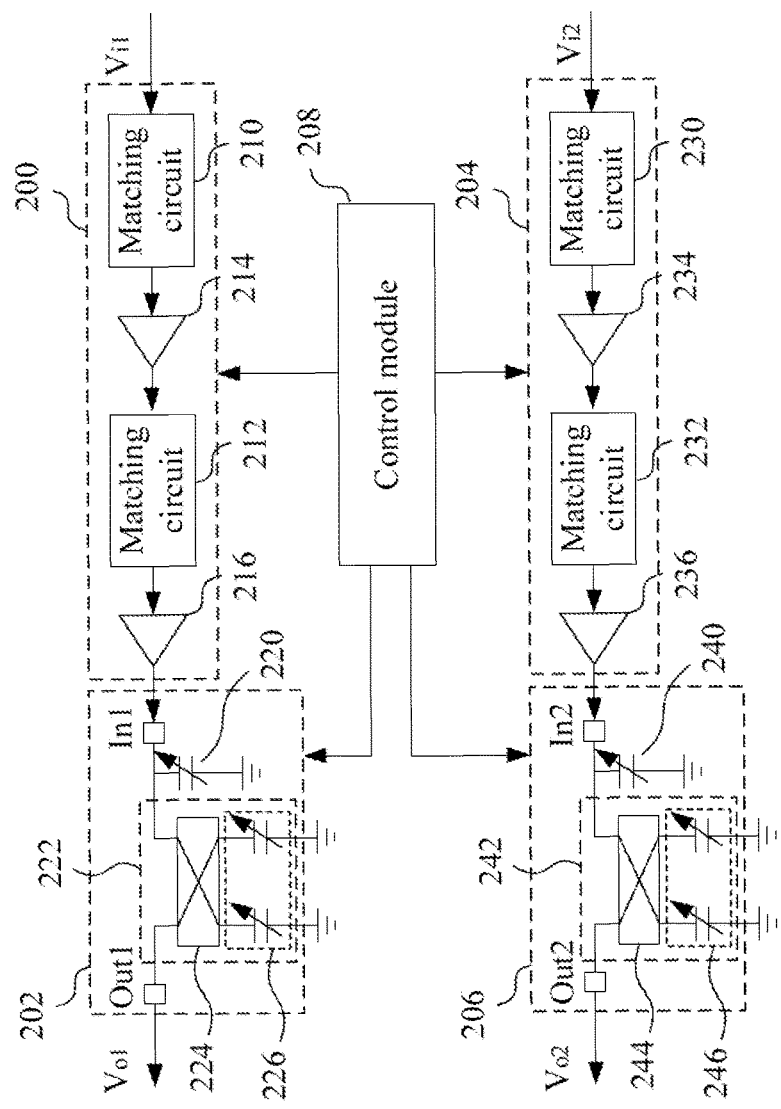
FIG. 2 is a block diagram of the power amplifier in an embodiment of the present invention.

FIG. 2 is a block diagram of the power amplifier 100 in an embodiment of the present invention. The power amplifier 100 includes a first power amplifying path 200, a first matching module 202, a second power amplifying path 204 and a second matching module 206.

The power amplifier 100 receives a first input signal Vi1 within a first frequency range and/or a second input signal Vi2 within a second frequency range, wherein the frequencies of the second frequency range are higher than those of the first frequency range. In an embodiment, the first frequency range is from 700 MHz to 2000 MHz and the second frequency range is from 2000 MHz to 2700 MHz. The first input signal Vi1 and the second input signal Vi2 are radio frequency signals.

The power amplifier 100 further amplifies the power of the first input signal Vi1 and/or the second input signal Vi2 to generate a first output signal Vo1 and/or a second output signal Vo2.

The first power amplifying path 200 receives the first input signal Vi1 within the first frequency range. The first input signal Vi1 corresponds to one of a plurality of first sub-frequency bands of the first frequency range. Take the definition of the long term evolution (LTE) technology as an example, the first input signal Vi1 can correspond to one of five frequency bands B5/(B8+B26), B14/B20, B12/B13/B17, B3/B4 and B1(B2+B25). Each of the symbols B1, B2, B3 . . . corresponds to a frequency bands around a specific frequency. For example, B2 corresponds to a frequency band around 1900 MHz and B12 corresponds to a frequency band around 700 MHz. It is noted that the number and the range of the frequency bands mentioned above are merely an example. The present invention is not limited thereto.

In an embodiment, the first power amplifying path 200 includes a plurality stages of matching circuits and a plurality stages of amplifying circuits connected in series, such as but not limited to the matching circuits 210 and 212 and the amplifying circuits 214 and 216. The matching circuits 210 and 212 and the amplifying circuits 214 and 216 perform an amplifying and matching process on the first input signal Vi1. In an embodiment, the power amplifier 100 further includes a control module 208 to control and provide power to the matching circuits and the amplifying circuits in the first power amplifying path 200 according to the first sub-frequency band that the first input signal Vi1 locates to perform the amplifying and matching process.

The first matching module 202 includes a first input end In1 and a first output end Out1. The first input end In1 is coupled to the first power amplifying path 200. The first matching module 202 further includes a first input variable load 220 and a first phase-shifting circuit 222.

The first input variable load 220 is electrically connected to the first input end In1 to receive the first input signal Vi1 therefrom, and the first input variable load 220 adjusts the magnitude of the first input signal Vi1 by adjusting the load value of the first input variable load 220. In the present embodiment, the first input variable load 220 is illustrated as a variable capacitor. Therefore, the magnitude of the first input signal Vi1 can be adjusted by adjusting the capacitive value of the first input variable load 220. In other embodiments, the first input variable load 220 can be a variable inductor such that the magnitude of the first input signal Vi1 can be adjusted by adjusting the inductive value of the first input variable load 220.

The first phase-shifting circuit 222 includes a first coupler 224 and a group of first phase-shifting variable loads 226. The first coupler 224 is electrically connected to the first input end In1 and the first output end Out1 to receive the first input signal Vi1 from the first input end In1.

The group of first phase-shifting variable loads 226 is electrically connected to the first coupler 224. In an embodiment, the phase of the first input signal Vi1 is adjusted by adjusting the load values of the group of first phase-shifting variable loads 226 to an identical value.

In the present embodiment, the group of first phase-shifting variable loads 226 is illustrated as two variable capacitors. Therefore, the phase of the first input signal Vi1 is adjusted by adjusting the capacitive values of the group of first phase-shifting variable loads 226 to an identical value. In other embodiments, the group of first phase-shifting variable loads 226 can be variable inductors such that the phase of the first input signal Vi1 is adjusted by adjusting the inductive values of the group of first phase-shifting variable loads 226 to an identical value.

In an implementation example, the magnitude of the first input signal Vi1 is adjusted by adjusting the load value of the first input variable load 220 first, and the phase of the first input signal Vi1 is adjusted by adjusting the load values of the group of first phase-shifting variable loads 226 subsequently. In an embodiment, the load values of the first input variable load 220 and the group of first phase-shifting variable loads 226 are adjusted by the control module 208 according to the first sub-frequency band that the first input signal Vi1 locates.

The second power amplifying path 204 receives the second input signal Vi2 within the second frequency range. The second input signal Vi2 correspond to one of a plurality of second sub-frequency bands of the second frequency range. Take the definition of the long term evolution (LTE) technology as an example, the second input signal Vi2 can correspond to one of three frequency bands B40, B38/B41 and BAND 7. Each of the symbols B40, B38, B41 . . . corresponds to a frequency bands around a specific frequency. For example, B38 corresponds to a frequency band around 2500 MHz and B40 corresponds to a frequency band around 2300 MHz. It is noted that the number and the range of the frequency bands mentioned above are merely an example. The present invention is not limited thereto.

In an embodiment, the second power amplifying path 204 includes a plurality stages of matching circuits and a plurality stages of amplifying circuits connected in series, such as but not limited to the matching circuits 230 and 232 and the amplifying circuits 234 and 236. The matching circuits 230 and 232 and the amplifying circuits 234 and 236 perform an amplifying and matching process on the second input signal Vi2. In an embodiment, the control module 208 can control and provide power to the matching circuits and the amplifying circuits in the second power amplifying path 204 according to the second sub-frequency band that the second input signal Vi2 locates to perform the amplifying and matching process.

The second matching module 206 includes a second input end In2 and a second output end Out2. The second input end In2 is coupled to the second power amplifying path 204. The second matching module 206 further includes a second input variable load 240 and a second phase-shifting circuit 242.

The second input variable load 240 is electrically connected to the second input end In2 to receive the second input signal Vi2 therefrom, and the second input variable load 240 adjusts the magnitude of the second input signal Vi2 by adjusting the load value of the second input variable load 240. In the present embodiment, the second input variable load 240 is illustrated as a variable capacitor. Therefore, the magnitude of the second input signal Vi2 can be adjusted by adjusting the capacitive value of the second input variable load 240. In other embodiments, the second input variable load 240 can be a variable inductor such that the magnitude of the second input signal Vi2 can be adjusted by adjusting the inductive value of the second input variable load 240.

The second phase-shifting circuit 242 includes a second coupler 244 and a group of second phase-shifting variable loads 246. The second coupler 244 is electrically connected to the second input end In2 and the second output end Out2 to receive the second input signal Vi2 from the second input end In2.

The group of second phase-shifting variable loads 246 is electrically connected to the second coupler 244. In an embodiment, the phase of the second input signal Vi2 is adjusted by adjusting the load values of the group of second phase-shifting variable loads 246 to an identical value.

In the present embodiment, the group of second phase-shifting variable loads 246 is illustrated as two variable capacitors. Therefore, the phase of the second input signal Vi2 is adjusted by adjusting the capacitive values of the group of second phase-shifting variable loads 246 to an identical value. In other embodiments, the group of second phase-shifting variable loads 246 can be variable inductors such that the phase of the second input signal Vi2 is adjusted by adjusting the inductive values of the group of second phase-shifting variable loads 246 to an identical value.

In an implementation example, the magnitude of the second input signal Vi2 is adjusted by adjusting the load value of the second input variable load 240 first, and the phase of the second input signal Vi2 is adjusted by adjusting the load values of the group of second phase-shifting variable loads 246 subsequently. In an embodiment, the load values of the second input variable load 240 and the group of second phase-shifting variable loads 246 are adjusted by the control module 208 according to the second sub-frequency band that the second input signal Vi2 locates.

As a result, the wireless communication device 1 can receive signals of different frequency bands and of different modes within a wide frequency range by using a single power amplifier circuit due to the design of the power amplifier 100. Further, an amplifying and matching process can be performed by the power amplifier 100 to adjust the magnitude and the phase of the signals such that the signals are transmitted by the antenna. The area and the cost of the wireless communication device 1 are therefore greatly reduced.

Figure 3:
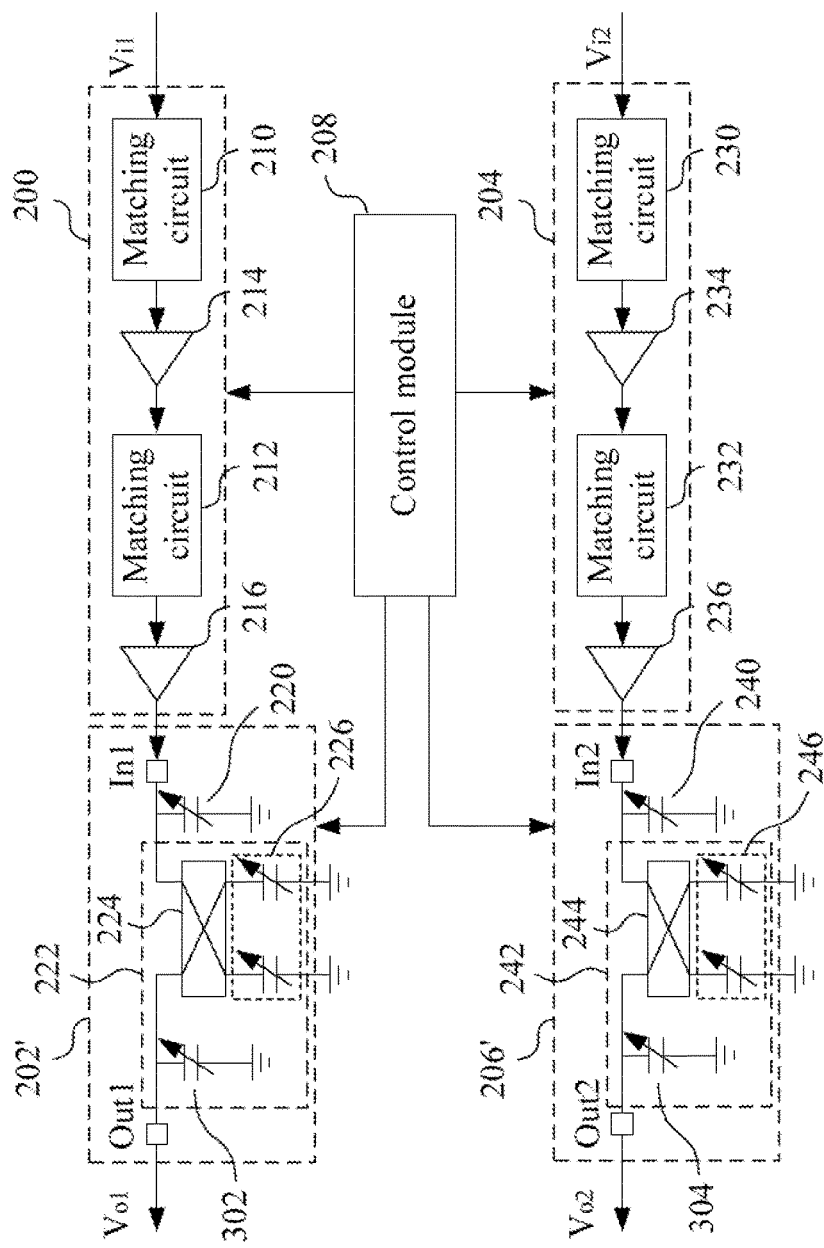
FIG. 3 is a block diagram of a power amplifier in an embodiment of the present invention.

FIG. 3 is a block diagram of a power amplifier 300 in an embodiment of the present invention. The power amplifier 300 illustrated in FIG. 3 includes the first power amplifying path 200, a first matching module 202', the second power amplifying path 204 and a second matching module 206'. The structure of the first power amplifying path 200, the first matching module 202', the second power amplifying path 204 and the second matching module 206' are similar to that of the first power amplifying path 200, a first matching module 202, the second power amplifying path 204 and a second matching module 206 illustrated in FIG. 2. The detail of the identical components is not discussed herein.

In the present embodiment, the first matching module 202 further includes a first output variable load 302. The second matching module 206' further includes a second output variable load 304.

The first output variable load 302 is electrically connected to the first output end Out1. In an implementation example, the first matching module 202' further adjust the magnitude of the first input signal Vi1 by adjusting the load value of the first output variable load 302 after the first input variable load 220 and the group of first phase-shifting variable loads 226 respectively adjust the magnitude and the phase of the first input signal Vi1.

In the present embodiment, the first output variable load 302 is illustrated as a variable capacitor. Therefore, the magnitude of the first input signal Vi1 can be adjusted by adjusting the capacitive value of the first output variable load 302. In other embodiments, the first output variable load 302 can be a variable inductor such that the magnitude of the first input signal Vi1 can be adjusted by adjusting the inductive value of the first output variable load 302.

Similarly, the second output variable load 304 is electrically connected to the second output end Out2. In an implementation example, the second matching module 206 further adjust the magnitude of the second input signal Vi2 by adjusting the load value of the second output variable load 304 after the second input variable load 240 and the group of second phase-shifting variable loads 246 respectively adjust the magnitude and the phase of the second input signal Vi2.

In the present embodiment, the second output variable load 304 is illustrated as a variable capacitor. Therefore, the magnitude of the second input signal Vi2 can be adjusted by adjusting the capacitive value of the second output variable load 304. In other embodiments, the second output variable load 304 can be a variable inductor such that the magnitude of the second input signal Vi2 can be adjusted by adjusting the inductive value of the second output variable load 304.

In an embodiment, the load values of the first output variable load 302 and the second output variable load 304 are adjusted by the control module 208 according to the first and the second sub-frequency bands that the first and the second input signals Vi1 and Vi2 locate respectively.

Figure 4:
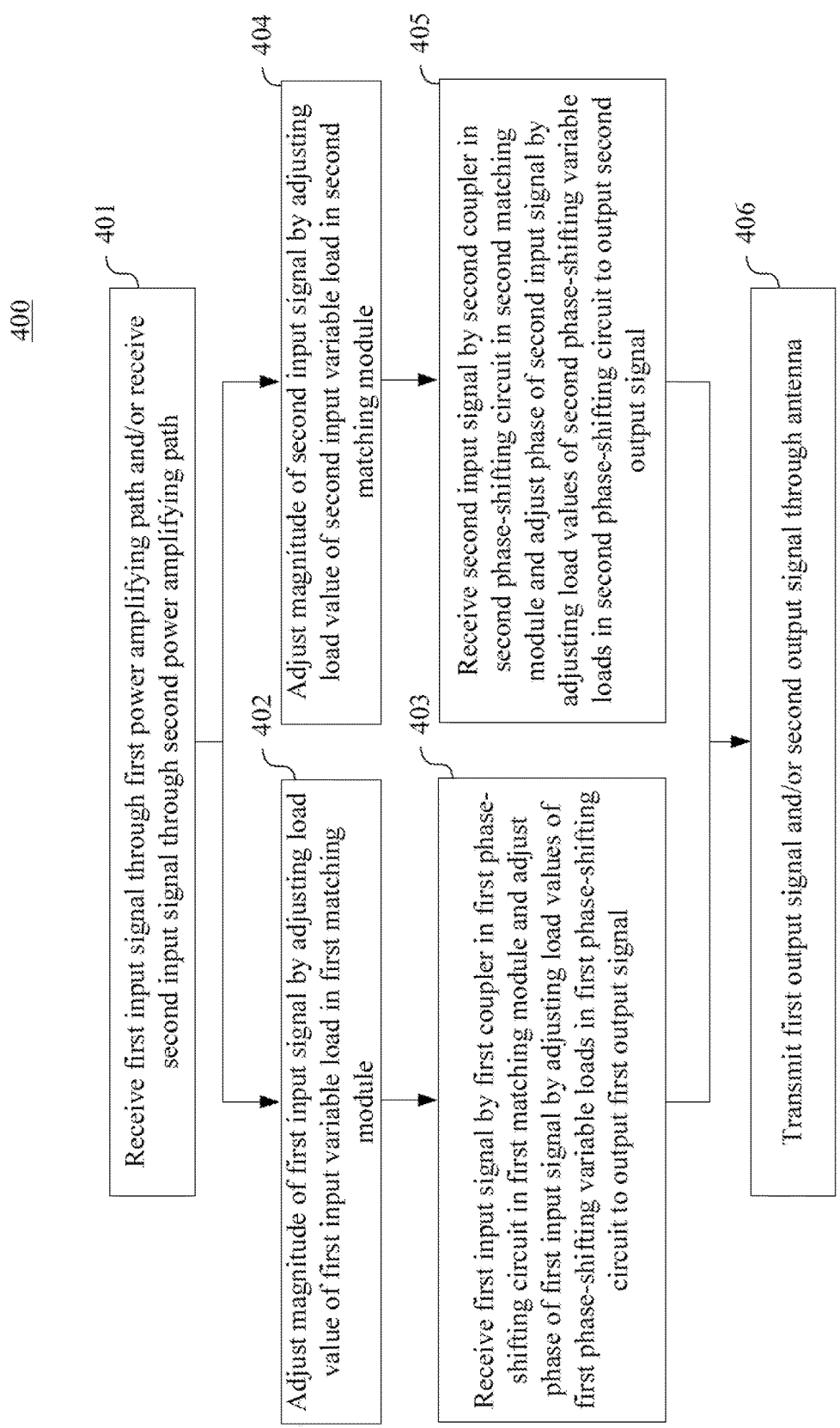
FIG. 4 is a flow chart of a wireless communication method in an embodiment of the present invention.

FIG. 4 is a flow chart of a wireless communication method 400 in an embodiment of the present invention. The wireless communication method 400 can be used in the wireless communication device 1 illustrated in FIG. 1. The wireless communication method 400 includes the steps outlined below (The steps are not recited in the sequence in which the steps are performed. That is, unless the sequence of the steps is expressly indicated, the sequence of the steps is interchangeable, and all or part of the steps may be simultaneously, partially simultaneously, or sequentially performed).

In step 401, a first input signal Vi1 within a first frequency range is received through a first power amplifying path 200 and/or receiving a second input signal Vi2 within a second frequency range through a second power amplifying path 204, wherein the frequencies of the second frequency range are higher than those of the first frequency range.

In step 402, the magnitude of the first input signal Vi1 is adjusted by adjusting the load value of the first input variable load 220 in the first matching module 202.

In step 403, the first input signal Vi1 is received by the first coupler 224 in the first phase-shifting circuit 222 in the first matching module 202 and the phase of the first input signal Vi1 is adjusted by adjusting the load values of the group of first phase-shifting variable loads 226 in the first phase-shifting circuit 222 that is electrically connected to the first coupler 224 to further output the first output signal Vo1.

In step 404, the magnitude of the second input signal Vi2 is adjusted by adjusting the load value of the second input variable load 240 in the second matching module 206.

In step 405, the second input signal Vi2 is received by the second coupler 244 in the second phase-shifting circuit 242 in the second matching module 206 and the phase of the second input signal Vi2 is adjusted by adjusting the load values of the group of second phase-shifting variable loads 246 in the second phase-shifting circuit 242 that is electrically connected to the second coupler 244 to further output the second output signal Vo2.

In step 406, the first output signal Vo1 and/or the second output signal Vo2 are transmitted through the antenna 16.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A power amplifier, comprising:
a first power amplifying path to receive a first input signal within a first frequency range, wherein the first input signal corresponds to one of a plurality of first sub-frequency bands of the first frequency range;
a first matching module comprising a first input end and a first output end, wherein the first input end is coupled to the first power amplifying path, and the first matching module further comprises:
a first input variable load electrically connected to the first input end to receive the first input signal therefrom, and the first input variable load adjusting the magnitude of the first input signal by adjusting the load value of the first input variable load; and
a first phase-shifting circuit comprising a first coupler and a group of first phase-shifting variable loads, wherein the first coupler is electrically connected to the first input end and the first output end to receive the first input signal from the first input end, and the phase of the first input signal is adjusted by adjusting the load values of the group of first phase-shifting variable loads to an identical value so as to output a first output signal at the first output end;

a second power amplifying path to receive a second input signal within a second frequency range, wherein the second input signal corresponds to one of a plurality of second sub-frequency bands of the second frequency range, and wherein the frequencies of the second frequency range are higher than those of the first frequency range; and a second matching module comprising a second input end and a second output end, wherein the second input end is coupled to the second power amplifying path, and the second matching module further comprises:

a second input variable load electrically connected to the second input end to receive the second input signal therefrom, and the second input variable load adjusting the magnitude of the second input signal by adjusting the load value of the second input variable load; and a second phase-shifting circuit comprising a second coupler and a group of second phase-shifting variable loads, wherein the second coupler is electrically connected to the second input end and the second output end to receive the second input signal from the second input end, and the phase of the second input signal is adjusted by adjusting the load values of the group of second phase-shifting variable loads to an identical value so as to output a second output signal at the second output end.

2. The power amplifier of claim 1, wherein each of the first input variable load, the second input variable load, the group of first phase-shifting variable loads and the group of second phase-shifting variable loads is a variable capacitor or a variable inductor.

3. The power amplifier of claim 1, wherein the first input variable load and the first phase-shifting circuit respectively adjust the magnitude and the phase of the first input signal; the second input variable load and the second phase-shifting circuit respectively adjust the magnitude and the phase of the second input signal.

4. The power amplifier of claim 1, wherein the first matching module further comprises a first output variable load electrically connected to the first output end, and the first output variable load adjusts the magnitude of the first output signal by adjusting the load value of the first output variable load; the second matching module further comprises a second output variable load electrically connected to the second output end, and the second output variable load adjusts the magnitude of the second output signal by adjusting the load value of the second output variable load.

5. The power amplifier of claim 4, wherein each of the first output variable load and the second output variable load is a variable capacitor or a variable inductor.

6. The power amplifier of claim 4, wherein the first output variable load further adjusts the magnitude of the first input signal after the first input variable load and the first phase-shifting circuit respectively adjust the magnitude and the phase of the first input signal; the second output variable load further adjusts the magnitude of the second input signal after the second input variable load and the second phase-shifting circuit respectively adjust the magnitude and the phase of the second input signal.

7. The power amplifier of claim 1, wherein the first frequency range is from 700 MHz to 2000 MHz, and the second frequency range is from 2000 MHz to 2700 MHz.

8. The power amplifier of claim 1, wherein each of the first and the second power amplifying paths comprises a plurality stages of matching circuits and a plurality stages of amplifying circuits connected in series to perform an amplifying and matching process on the first and the second input signals respectively.

9. A wireless communication device comprising:
a power amplifier, comprising:
a first power amplifying path to receive a first input signal within a first frequency range, wherein the first input signal corresponds to one of a plurality of first sub-frequency bands of the first frequency range;

a first matching module comprising a first input end and a first output end, wherein the first input end is coupled to the first power amplifying path, and the first matching module further comprises:

a first input variable load electrically connected to the first input end to receive the first input signal therefrom, and the first input variable load adjusting the magnitude of the first input signal by adjusting the load value of the first input variable load; and a first phase-shifting circuit comprising a first coupler and a group of first phase-shifting variable loads, wherein the first coupler is electrically connected to the first input end and the first output end to receive the first input signal from the first input end, and the phase of the first input signal is adjusted by adjusting the load values of the group of first phase-shifting variable loads to an identical value so as to output a first output signal at the first output end;

a second power amplifying path to receive a second input signal within a second frequency range, wherein the second input signal corresponds to one of a plurality of second sub-frequency bands of the second frequency range, and wherein the frequencies of the second frequency range are higher than those of the first frequency range;

a second matching module comprising a second input end and a second output end, wherein the second input end is coupled to the second power amplifying path, and the second matching module further comprises:

a second input variable load electrically connected to the second input end to receive the second input signal therefrom, and the second input variable load adjusting the magnitude of the second input signal by adjusting the load value of the second input variable load; and a second phase-shifting circuit comprising a second coupler and a group of second phase-shifting variable loads, wherein the second coupler is electrically connected to the second input end and the second output end to receive the second input signal from the second input end, and the phase of the second input signal is adjusted by adjusting the load values of the group of second phase-shifting variable loads to an identical value so as to output a second output signal at the second output end; and an antenna coupled to the power amplifier to transmit the first output signal and/or the second output signal.

10. The wireless communication device of claim 9, wherein each of the first input variable load, the second input variable load, the group of first phase-shifting variable loads and the group of second phase-shifting variable loads is a variable capacitor or a variable inductor.

11. The wireless communication device of claim 9, wherein the first input variable load and the first phase-shifting circuit respectively adjust the magnitude and the phase of the first input signal; the second input variable load and the second phase-shifting circuit respectively adjust the magnitude and the phase of the second input signal.

12. The wireless communication device of claim 9, wherein the first matching module further comprises a first output variable load electrically connected to the first output end, and the first output variable load adjusts the magnitude of the first output signal by adjusting the load value of the first output variable load; the second matching module further comprises a second output variable load electrically connected to the second output end, and the second output variable load adjusts the magnitude of the second output signal by adjusting the load value of the second output variable load.

13. The wireless communication device of claim 12, wherein each of the first output variable load and the second output variable load is a variable capacitor or a variable inductor.

14. The wireless communication device of claim 12, wherein the first output variable load further adjusts the magnitude of the first input signal after the first input variable load and the first phase-shifting circuit respectively adjust the magnitude and the phase of the first input signal; the second output variable load further adjusts the magnitude of the second input signal after the second input variable load and the second phase-shifting circuit respectively adjust the magnitude and the phase of the second input signal.

15. The wireless communication device of claim 9, wherein the first frequency range is from 700 MHz to 2000 MHz, and the second frequency range is from 2000 MHz to 2700 MHz.

16. The wireless communication device of claim 9, wherein each of the first and the second power amplifying paths comprises a plurality stages of matching circuits and a plurality stages of amplifying circuits connected in series to perform an amplifying and matching process on the first and the second input signals respectively.

17. A wireless communication method used in a wireless communication device, comprising:
receiving a first input signal within a first frequency range through a first power amplifying path and/or receiving a second input signal within a second frequency range through a second power amplifying path; wherein the first input signal corresponds to one of a plurality of first sub-frequency bands of the first frequency range and the second input signal corresponds to one of a plurality of second sub-frequency bands of the second frequency range, and wherein the frequencies of the second frequency range are higher than those of the first frequency range;
adjusting the magnitude of the first input signal by adjusting the load value of a first input variable load in a first matching module;
receiving the first input signal by a first coupler in a first phase-shifting circuit in the first matching module, and adjusting the phase of the first input signal by adjusting the load values of a group of first phase-shifting variable loads in the first phase-shifting circuit to an identical value so as to output a first output signal, and wherein the group of first phase-shifting variable loads are electrically connected to the first coupler;
adjusting the magnitude of the second input signal by adjusting the load value of a second input variable load in a second matching module;
receiving the second input signal by a second coupler in a second phase-shifting circuit in the second matching module, and adjusting the phase of the second input signal by adjusting the load values of a group of second phase-shifting variable loads in the second phase-shifting circuit to an identical value so as to output a second output signal, and wherein the group of second phase-shifting variable loads are electrically connected to the second coupler;
transmitting the first output signal and/or the second output signal through an antenna.

18. The wireless communication method of claim 17, further comprising:
adjusting the magnitude of the first input signal by a first output variable load in the first matching module after the magnitude and the phase of the first input signal are respectively adjusted by the first input variable load and the first phase-shifting circuit; and
adjusting the magnitude of the second input signal by a second output variable load in the second matching module after the magnitude and the phase of the second input signal are respectively adjusted by the second input variable load and the second phase-shifting circuit.

* * * * *